United States Patent [19]

Tobita

[11] Patent Number: 5,418,747

[45] Date of Patent: * May 23, 1995

[54] DYNAMIC RANDOM ACCESS MEMORY HAVING A PLURALITY OF RATED VOLTAGES AS OPERATION SUPPLY VOLTAGE AND OPERATING METHOD THEREOF

[75] Inventor: Youichi Tobita, Hyogo, Japan

[73] Assignee: Mitsubishi Denki Kabushiki Kaisha, Tokyo, Japan

[*] Notice: The portion of the term of this patent subsequent to Jul. 21, 2009 has been disclaimed.

[21] Appl. No.: 220,649

[22] Filed: Mar. 31, 1994

Related U.S. Application Data

[60] Continuation of Ser. No. 829,144, Jan. 31, 1992, Pat. No. 5,315,550, which is a division of Ser. No. 437,425, Nov. 16, 1989, Pat. No. 5,132,932.

[30] Foreign Application Priority Data

May 19, 1989 [JP] Japan .................................. 1-127114

[51] Int. Cl.⁶ ............................. G11C 7/00; G11C 8/00
[52] U.S. Cl. .................................... 365/194; 365/222; 365/226
[58] Field of Search ................. 365/194, 222, 226, 228

[56] References Cited

U.S. PATENT DOCUMENTS

| | | | |
|---|---|---|---|
| 4,016,954 | 12/1977 | Proebsting et al. | 365/203 X |
| 4,616,346 | 10/1986 | Nakaizumi et al. | 365/229 |
| 4,631,707 | 12/1986 | Watanabe | 365/228 |
| 4,672,586 | 6/1987 | Shimohigashi et al. | 365/229 |
| 4,686,386 | 8/1987 | Tadao | 365/228 |
| 4,800,533 | 1/1989 | Arakawa | 365/228 |
| 4,811,290 | 3/1989 | Watanabe | 365/149 |
| 4,831,595 | 5/1989 | Bone | 365/229 |
| 4,881,205 | 11/1989 | Aihara | 365/222 |
| 4,939,695 | 7/1990 | Isobe et al. | 365/222 |
| 4,943,960 | 7/1990 | Komatsu et al. | 365/222 |
| 5,031,150 | 7/1991 | Ohsawa | 365/193 |
| 5,293,338 | 3/1994 | Ihara | 365/19 X |
| 5,295,111 | 3/1994 | Tsujimoto | 365/194 X |

FOREIGN PATENT DOCUMENTS 0102618 3/1984 European Pat. Off. .
61-271694 12/1986 Japan .
62-232796 10/1987 Japan .

OTHER PUBLICATIONS

Nikkei Electronics Publication, Jan. 8, 1979, pp. 110-133.
Nikkei Electronics Publication, No. 451, Jul. 11, 1988, pp. 181-193.

*Primary Examiner*—Do Hyun Yoo
*Attorney, Agent, or Firm*—Lowe, Price, LeBlanc & Becker

[57] ABSTRACT

A dynamic random access memory having a plurality of rated voltages as an operation supply voltage operates accurately with a sufficient operating margin for each rated voltage. The dynamic random access memory has a circuit for generating a signal for defining operation speed/timing of a sense amplifier depending on the operation supply voltage, and a circuit for driving the sense amplifier in response to an output of a defining signal generating circuit. The sense amplifier driving circuit comprises a first gate for transmitting a sense amplifier activating signal as it is in response to the defining signal, a second gate for passing therethrough a sense amplifier activating signal passed through a delay circuit in response to the defining signal, and transistors for driving the sense amplifier in response to outputs of the first and second gates. One of the first and second gates is activated by the defining signal. An operation speed/timing instructing signal is applied externally or from a supply voltage detecting circuit. In the case that rated values are varied depending on an operation mode, there are provided a circuit for detecting the operation mode in response to activating timings of a row address strobe signal, a column address strobe signal and a write signal, and a circuit for generating a defining signal in response to an output of this operation mode detecting circuit and the operation speed/timing instructing signal.

5 Claims, 11 Drawing Sheets

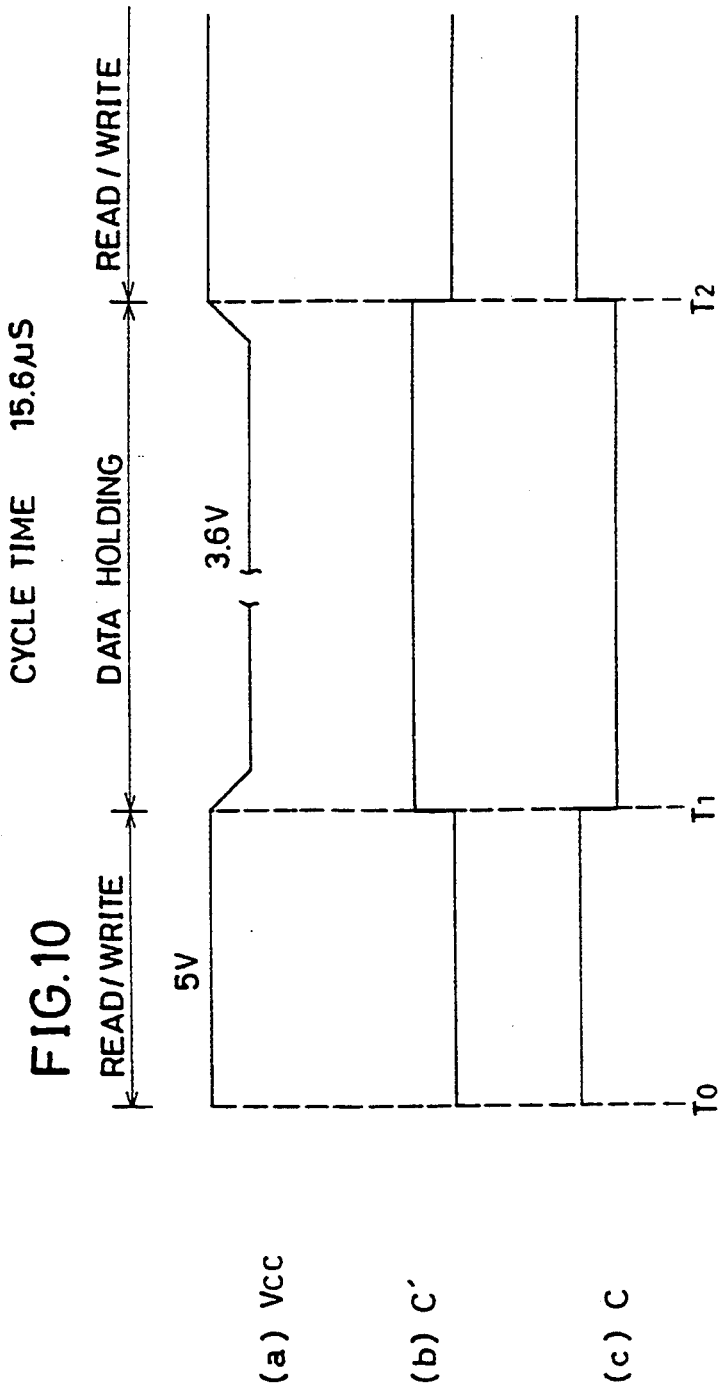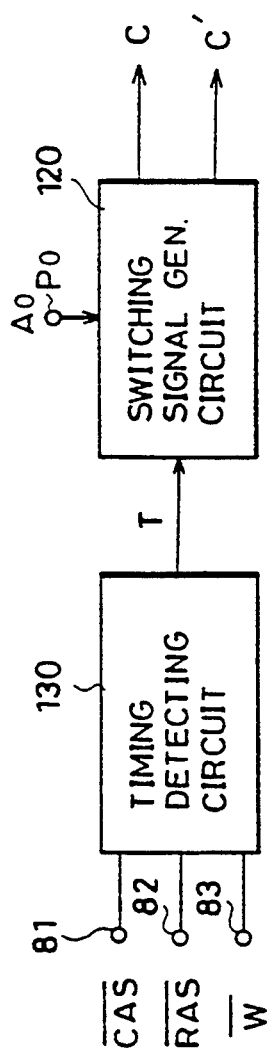

_

DYNAMIC RANDOM ACCESS MEMORY HAVING A PLURALITY OF RATED VOLTAGES AS OPERATION SUPPLY VOLTAGE AND OPERATING METHOD THEREOF

This application is a continuation of application Ser. No. 07/829,144 filed Jan. 31, 1992, now U.S. Pat. No. 5,315,550, which is a division of application Ser. No. 07/437,425, filed Nov. 16, 1989, now U.S. Pat. No. 5,132,932.

BACKGROUND OF THE INVENTION

1. Field of the Invention

The present invention relates generally to a dynamic random access memory and, more particularly, to the configuration of and the operation method of a dynamic random access memory which can easily cope with decreased rated values of an operation supply voltage.

2. Description of the Background Art

In recent years, semiconductor memories are generally employed in a variety of fields. One of the semiconductor memories is called a Dynamic Random Access Memory (hereinafter referred to as a DRAM). First of all, the configuration of and the operation of a conventionally employed DRAM will be described.

FIG. 1 illustrates one example of the schematic configuration of the entire read-out portion of the conventional DRAM. Referring to FIG. 1, the DRAM comprises a memory cell array MA having memory cells of storing information arranged in a matrix of rows and columns, an address buffer AB for generating an internal address in response to an external address which is externally applied, an X decoder ADX for receiving an internal row address from the address buffer AB to select a corresponding row of the memory cell array MA, and a Y decoder ADY for receiving an internal column address from the address buffer AB to select a corresponding column of the memory cell array MA.

The address buffer AB receives a row address for designating a row of the memory cell array MA and a column address for designating a column of the memory cell array MA in a time division multiplexing manner, generates an internal row address and an internal column address at their respective predetermined timings, and applies the addresses to the respective X decoder ADX and Y decoder ADY.

In order to read-out data of a memory cell designated by the external address, the DRAM further includes sense amplifiers for sensing and amplifying the data of the memory cells connected to the row selected by a row address decode signal from the X decoder ADX, an input/output interface (I/O) for transmitting the data of one of the memory cells in the selected row, which is connected to a corresponding column, to an output buffer OB in response to a column address decode signal from the Y decoder ADY, and the output buffer OB for transmitting the memory cell data transmitted via the input/output interface (I/O) to the outside of the DRAM.

The sense amplifiers and the input/output interface (I/O) are together shown in one block SI in FIG. 1. The output buffer OB receives read-out data transmitted from the block SI and converts the data to corresponding output data Dout to output the same.

A peripheral circuit CG for control signal generation is provided so as to generate control signals for controlling various operation timings of the DRAM. The peripheral circuit CG for control signal generation generates a precharge potential $V_B$, a word line driving signal Rn, an equalizing signal $\phi_E$, a precharge signal $\phi_P$, and a sense amplifier activating signal $\phi_S$, which will be described later.

A pad PA is provided to apply an operation supply voltage to the DRAM. The pad PA being connected to an external supply terminal receives the operation supply voltage $V_{cc}$ externally applied and transmits an internal operation supply voltage $V_{cc}$. A semiconductor chip CH has a plurality of bonding pads on its peripheral portion to provide connections between the DRAM and external devices; however, only a pad PA for a power supply is typically illustrated in FIG. 1.

FIG. 2 illustrates the schematic configuration of the memory cell array shown in FIG. 1 and of circuits related thereto. Referring to FIG. 2, the memory cell array MA comprises word lines WL1, WL2, . . . , WLn each for selecting a row of the memory cell array MA, and bit line pairs BL0, $\overline{BL0}$, BL1, $\overline{BL1}$, . . . , BLm, $\overline{BLm}$ each for selecting a column of the memory cell array MA. The bit lines BL0, $\overline{BL0}$, . . . , BLm, $\overline{BLm}$ have a folded bit line scheme, and two of the bit lines form one bit line pair. That is, the bit lines BL0, $\overline{BL0}$ form a bit line pair, and the bit lines BL1, $\overline{BL1}$ form another bit line pair. The bit lines BLm, $\overline{BLm}$ form a bit line pair in the same manner as above.

Memory cells 1 for storing information are provided at intersections of the bit lines BL0, $\overline{BL0}$, . . . , BLm, $\overline{BLm}$ and the alternate word lines, respectively. That is, for each bit line pair, a memory cell 1 is connected at the intersection of a word line and either one of the bit lines in a pair.

The bit line pairs BL0, $\overline{BL0}$, . . . , BLm, $\overline{BLm}$ each have a precharge/equalizing circuit 150 provided thereon for equalizing a potential on each of the bit lines and precharging the same to a predetermined potential $V_B$ in a standby period of the DRAM.

The bit line pairs BL0, $\overline{BL0}$, . . . , BLm, $\overline{BLm}$ each have a sense amplifier 50 provided thereon for sensing and amplifying data of selected memory cells. The sense amplifier 50 is activated in response to a first sense amplifier driving signal $\phi_A$ and a second sense amplifier driving signal $\phi_B$ respectively transmitted via a first signal line 14 and a second signal line 17, to detect and differentially amplify a potential difference between its corresponding bit lines in a pair.

In order to transmit the data of a selected memory cell to the output buffer OB (refer to FIG. 1), the bit line pairs BL0, $\overline{BL0}$, . . . , BLm, $\overline{BLm}$ have transfer gates T0, and T0', T1 and T1', and Tm and Tm' provided thereon, respectively, which are turned on responsive to a column address decode signal from the Y decoder ADY and connect the corresponding bit line pair to data input/output buses I/O, $\overline{I/O}$. The transfer gates T0 and T0' are provided corresponding to the bit lines BL0, $\overline{BL0}$, the transfer gates T1 and T1' to the bit lines BL1, BL1, and the transfer gates Tm and Tm' to the bit line pair BLm, $\overline{BLm}$. A pair of the transfer gates is turned on responsive to the column address decoder signal from the Y decoder ADY, so that its corresponding bit line pair is connected to the data input/output buses I/O, $\overline{I/O}$. The sense amplifiers 50, the transfer gates T0, T0' to Tm, Tm' and the data input/output buses I/O, $\overline{I/O}$ all correspond to the block SI shown in FIG. 1.

FIG. 3 is a detail view of the circuit configuration with respect to one of the bit line pairs in the configuration shown in FIG. 2, and is particularly a circuit diagram illustrating in detail the configuration of a device for operating the sense amplifier 50.

Referring to FIG. 3, a memory cell 1 comprises a memory capacitor 6 for storing information in the form of a charge, and a select transistor 5 which is turned on responsive to a word line driving signal Rn transmitted onto a word line 3 to connect the memory capacitor 6 to a bit line 2. The select transistor 5 is formed of an n channel insulating gate field effect transistor (hereinafter referred to as an n-FET), and has its gate connected to the word line 3 and its source connected to the bit line 2. The memory capacitor 6 has one electrode connected to the drain of the select transistor 5 via a storage node 4 and the other electrode connected to a ground potential GND.

A precharge/equalizing circuit 150 includes n-FETs 9, 10 and 12. The n-FET 9 is turned on responsive to a precharge signal $\phi_P$ transmitted via a signal line 11 for precharge signal transmission, to transmit a precharge voltage $V_B$ transmitted via a signal line 8 for precharge potential transmission to the bit line 2. The n-FET 10 is turned on responsive to the precharge signal $\phi_P$ transmitted via the signal line 11 to transmit the precharge voltage $V_B$ transmitted via the signal line 8 to a bit line 7. The n-FET 12 is turned on responsive to an equalizing signal $\phi_P$ transmitted via a signal line 13 for equalizing signal transmission and electrically shorts the bit lines 2 and 7 to equalize potentials on the bit lines 2 and 7.

A sense amplifier 50 comprises p channel insulating gate field effect transistors (hereinafter referred to as p-FETs) 15 and 16, and n-FETs 18 and 19. The sense amplifier 50 is formed of the flip-flop of a CMOS configuration. The p-FETs 15 and 16 have their gates and their one electrodes cross-coupled, and the n-FETs 18 and 19 have their gates and their one electrodes cross-coupled. The connecting point of the one electrode of the p-FET 15 and that of the n-FET 18 is connected to the bit line 2. The connecting point of the one electrode of the p-FET 16 and that of the n-FET 19 is connected to the bit line 7. The other electrodes of the p-FETs 15 and 16 are connected to a signal line 14 for transmitting a first sense amplifier driving signal $\phi_A$. The other electrodes of the n-FETs 18 and 19 are connected to a signal line 17 for transmitting a second sense amplifier driving signal $\phi_B$.

n-FETs 26, 27 and 28 are provided between the signal lines 14 and 17 in order to precharge and equalize potentials on the signal lines 14 and 17 to a predetermined potential $V_B$. The n-FET 26 is turned on responsive to the precharge signal $\phi_P$ transmitted via the signal line 11 to transmit the precharge signal $V_B$ of a predetermined constant potential transmitted via the signal line 8 onto the signal line 14. The n-FET 27 is turned on responsive to the precharge signal $\phi_P$ transmitted via the signal line 11 to transmit the precharge voltage $V_B$ transmitted via the signal line 8 onto the signal line 17. The n-FET 28 is turned on responsive to the precharge signal $\phi_P$ transmitted via the signal line 11 and electrically shorts the signal lines 14 and 17 to equalize the potentials on these signal lines.

In order to operate the sense amplifier 50, a p-FET 22 is provided between the signal line 14 and a first terminal 24 for power supply potential (which corresponds to the pad PA shown in FIG. 1), which is turned on responsive to a first sense amplifier activating signal $\overline{\phi_S}$ to connect the signal line 14 to a first power supply line 31.

Similarly, an n-FET 25 is provided between the signal line 17 and a second terminal 29 for power supply potential, which is turned on responsive to a second sense amplifier activating signal $\phi_S$ to connect the signal line 17 to a second power supply line 30.

The sense amplifier activating signals $\overline{\phi_S}$ and $\phi_S$ are applied to the gates of the p-FET 22 and n-FET 25 via signal input terminals 23a and 23b, respectively. The power supply terminals 24 and 29 are provided by the bonding pads formed on the peripheral portion of the semiconductor chip CH forming the DRAM thereon so as to receive a predetermined potential supply from the outside of the DRAM. The terminal 24 corresponds to the pad PA.

The bit line 2 has a parasitic capacitance 20, and the bit line 7 has a parasitic capacitance 21.

In order to avoid complexity in the drawing, a single word line 3 and one memory cell 1 connected to this word line 3 are only typically illustrated in the configuration of FIG. 3. Further, the precharge voltage $V_B$ for precharging the bit lines 2 and 7 and the signal lines 14 and 17 to a predetermined potential is normally set to be at a constant potential, half the operation supply voltage $V_{cc}$.

FIG. 4 is a signal waveform diagram illustrating the operation of the circuit configuration shown in FIG. 3. FIG. 4 illustrates a signal waveform of an operation in reading information of logic "1" stored in the memory cell 1 shown in FIG. 3. Next, referring to FIGS. 3 and 4, the reading operation of the memory cell data will be described.

The precharge signal $\phi_P$ and the equalizing signal $\phi_E$ are both logical high ("H" level) in a standby state from the time t0 to the time t1. Therefore, the n-FETs 9, 10 and 12 and the n-FETs 26, 27 and 28 are all ON, so that the bit lines 2 and 7 and the signal lines 14 and 17 are held at a predetermined precharge potential $V_B$ ($= V_{cc}/2$).

When the standby state ends and a memory cycle starts at the time t1, the precharge signal $\phi_P$ and the equalizing signal $\phi_E$ fall to be logical low (to the "L" level). Accordingly, the n-FETs 9, 10, 12, 26, 27 and 28 are all turned off.

When the precharge signal $\phi_P$ and equalizing signal $\phi_E$ go to the "L" level at the time t2, and then the n-FETs 9, 10, 12, 26, 27 and 28 are turned off, the internal row address is applied to the X decoder ADX from the address buffer AB shown in FIG. 1 to carry out a row selection in the memory cell array MA.

At the time t3, the word line driving signal Rn is transmitted onto a selected word line 3 (assuming that the word line 3 shown in FIG. 3 is selected), and the potential on the word line 3 rises. Accordingly, the select transistor 5 of the memory cell 1 is turned on, so that the memory capacitor 6 is connected to the bit line 2. As a result, a charge stored in the storage node 4 moves onto the bit line 2, so that the potential on the bit line 2 rises only by $\Delta V$. A value of the potential rise $\Delta V$ on the bit line 2 is determined by a capacitance value C6 of the memory capacitor 6, a capacitance value C20 of the parasitic capacitance 20 of the bit line 2, and a storage voltage V4 of the storage node 4, to attain normally a value from 100 to 200 mV.

At the time t4, the sense amplifier activating signal $\phi_S$ rises while the sense amplifier activating signal $\overline{\phi_S}$ falls down, and the n-FET 25 and the p-FET 22 are turned on, so that the first and second signal lines 14 and 17 are connected to the respective first and second power supply lines 31 and 30. Accordingly, the potential on the first signal line 14 starts rising, while the potential on the second signal line 17 starts falling. Due to the rising and falling of the potentials on the first and second signal lines 14 and 17, a flip-flop circuit (the sense amplifier 50) formed of the p-FETs 15, 16 and the n-FETs 18 and 19 is activated and thus starts a sense operation of memory cell data to differentially amplify a small potential difference $\Delta V$ between the bit lines 2 and 7. Since a selected memory cell is not connected to the bit line 7, the potential on the bit line 7 remains at $V_{cc}/2$ of a precharge level until the time t4.

In this sense operation, when the n-FET 19 is turned on due to the potential rising of $\Delta V$ on the bit line 2, the charge applied to the parasitic capacitance 21 is discharged onto the second signal line 17 via the n-FET 19, resulting in the lowering of the potential on the second signal line 17. Thus the potential on the bit line 7 falls to approximately 0 V at the time t5.

Meanwhile, due to the lowered potential on the bit line 7, the p-FET 15 is turned on, so that the potential on the first signal line 14 is transmitted onto the bit line 2 via the p-FET 15, and the potential on the bit line 2 rises to the $V_{cc}$ level. The potential on the bit line 2 is transmitted to the storage node 4 via the select transistor 5, and then the potential level of the storage node 4 becomes the level of $V_{cc}-V_{TN}$, so that the data is rewritten in the memory cell 1. The $V_{TN}$ is a threshold voltage of the select transistor 5.

When amplifying operations of signal potentials on the bit lines 2 and 7 are completed, and the potentials thereof are respectively established at the supply potential $V_{cc}$ level and the ground potential GND level, a column of the memory cell array is selected by an address decode signal from the column decoder ADY (see FIG. 1) before the time t8, and the bit lines 2 and 7 are connected to the data input/output buses I/O and $\overline{I/O}$ (see FIG. 2), so that information of the memory cell 1 is read out. The foregoing describes the operations of reading, amplifying and rewriting the data of the memory cell. With a series of these operations completed, there comes the standby state in preparation for the next memory cycle.

That is, when the word line driving signal Rn starts falling at the time t8, and falls to the "L" level of the ground potential level at the time t9, the select transistor 5 is turned off, and the memory cell 1 is electrically separated from the bit line 2 so as to be at the standby state.

When the sense amplifier activating signals $\phi_S$ and $\overline{\phi_S}$ respectively start falling and rising at the time t10, and then go to the lower level of the ground potential GND level and to the higher level of the supply voltage $V_{cc}$ level at the time t11, the p-FET 22 and the n-FET 25 are turned off, so that the sense amplifier is inactivated.

When the equalizing signal $\phi_E$ starts rising and the n-FET 12 is turned on at the time t12, the bit lines 2 and 7 are electrically connected to each other, so that the charge moves from the bit line 2 of the higher potential level to the bit line 7 of the lower potential level, and thus the potentials on the bit lines 2 and 7 both become a precharge voltage $V_B(=V_{cc}/2)$ at about the time t13. At the same time, turning off of the p-FET 22 and the n-FET 25 causes shifting of the charge between the first and second signal lines 14 and 17 in the high impedance state, and the bit lines 2 and 7, and thus makes the potential levels on the signal lines 14 and 17 attain the values of $V_{cc}/2+|V_{TP}|$ and $V_{cc}/2-V_{TN}$, respectively. Here, the $V_{TP}$ is a threshold voltage of the p-FETs 18 and 19.

When the precharge signal $\phi_P$ starts rising at the time t14, the n-FET 9, 10, 16, 17 and 28 start conducting, and when the precharge signal $\phi_P$ attains the "H" level of the supply voltage $V_{cc}$ level at the time t15, the n-FETs 9, 10, 26, 27 and 28 are all turned on. Accordingly, the precharge voltage $V_B$ is transmitted to the bit lines 2 and 7, and also the signal lines 14 and 17 are electrically connected to each other via the n-FET 28. Further, the respective potentials thereof are equalized with each other, and also a predetermined precharge voltage $V_B$ is transmitted via the n-FETs 26 and 27. Consequently, the potentials on the first and second signal lines 14 and 17 both attain the value of $V_{cc}/2$.

This shifting of the precharge signal $\phi_P$ to the "H" level causes the potentials on the bit lines 2 and 7 and the signal lines 14 and 17 to be stabilized, preparing for the next reading operation.

The above described DRAM has mainly been applied to main memory devices in small- through large-scale computers. However, due to a reduction in price per bit accompanied with the increased storage capacity of the DRAM, the DRAM with reduced price per bit has also been applicable to a field of sound data processing, e.g., recordings on automatic answering telephones and electronic pocketbooks etc.

However, batteries are usually employed as a power supply in such a field. In this case, for example, employing, as the power supply, three dry batteries of 1.5 V connected in series supplies 4.5 V of a power supply voltage.

Meanwhile, since the above described standard DRAM normally employs a TTL circuit (a transistor-transistor logic circuit formed of a bipolar transistor) as its external circuit, the DRAM is designed with the supply voltage of 5 V in order to enhance its compatibility to the TTL circuit. That is, various specification values of the DRAM is selected under the operation supply voltage of 5 V, and the parameter of each of the elements constituting the DRAM is designed with the operation supply voltage of 5 V.

As described above, when the operation supply voltage of the DRAM is 4.5 V, the value of which is obtained by connecting three dry batteries in series, there is already a difference of 0.5 V between this value and a design value of 5 V; however, when the batteries are used as an operation power supply, it should be taken into consideration that a voltage drop may occur due to the battery lives, so that it should be considered in general that the voltages of the dry batteries drop from 1.5 V to 1.2 V.

When the voltage of each of the batteries is 1.2 V, the supply voltage becomes 3.6 V. That is, the DRAM need be designed so that the operation supply voltage can normally operates even at 3.6 V, in order that the DRAM can sufficiently function also in the sound data processing field employing such batteries as the operation power supply.

Two main factors are presented for the fact that the currently used DRAM does not operate at a lower supply voltage, or an operating margin is considerably reduced. The one is concerned with the necessity of fast operations. In a standard DRAM, for example, a normal access time (the required time period from supplying of an address to reading or writing of a valid data) is required to be 80–120 ns, or a cycle time (the period from the time when a signal $\overline{RAS}$ is activated to the time when data writing in/reading from one memory cell is completed to shift again to a standby state) is required to be 160–220 ns.

The operation speed of the DRAM changes depending on the operation supply voltage. The access time (the cycle time) increases as the operation supply voltage decreases, and thus the above required times cannot be satisfied. For example, in the case of the DRAM with the operation supply voltage of 5 V and the access time of 100 ns, the access time increases to 150 ns as the supply voltage decreases to 3.6 V.

The other factor is that a read-out voltage from a memory cell decreases as the supply voltage decreases, so that the memory cell data cannot be amplified normally.

In general, a problem with respect to the access time (the cycle time) occurs around 4.5 V of the supply voltage, while another problem with respect to amplification of the memory cell data occurs around 4.0 V of the supply voltage.

Therefore, it has been difficult to apply a conventional DRAM as it is to a lower supply voltage field where the batteries are employed as the power supply, such as in the sound data processing field.

A configuration is disclosed in Japanese Patent Laying-Open No. 62-232796, wherein different supply voltages are applied to the gate of a sense amplifier driving FET in order to vary the operation speed of the sense amplifier. In this prior art, to cope with a deviation of memory cell capacitance depending on process parameter, an external supply voltage is changed depending on a memory cell capacitance value, to be applied to the gate of the sense amplifier driving FET. Therefore, it is assumed that the operation supply voltage is at a fixed level, and a sense amplifier activating timing is unvaried. Consequently, when the operation power supply has a small rated value, the operating margin decreases and thus the above described problems of the conventional DRAM cannot be eliminated in the prior art.

SUMMARY OF THE INVENTION

It is an object of the present invention to provide a DRAM which can easily cope with a lowered supply voltage.

It is another object of the present invention to provide a DRAM operable in a wide range of the supply voltage.

It is a further object of the present invention to provide a DRAM operating normally even if a plurality of rated voltages are set for the supply voltage.

It is a still further object of the present invention to provide a DRAM which can cope with different rated values of the supply voltage by changing an access time.

It is an another further object of the present invention to provide a DRAM which can easily cope with a change in the rated value of an operation supply voltage by changing an activating timing and/or an operation speed of a sense amplifier depending on the rated value of the operation supply voltage.

It is a still further another object of the present invention to provide a method of operating a dynamic random access memory accurately even if the rated value of the supply voltage is changed.

A DRAM according to the present invention includes circuitry responsive to a control signal externally applied for defining at least one of operation speed and timing of a sense amplifier, and circuitry responsive to a sense amplifier activating signal and an output of the operation defining circuitry for operating the sense amplifier according to the defined operation speed and/or timing.

Another DRAM according to the present invention includes circuitry for detecting an operation supply voltage externally applied, circuitry responsive to an output of the voltage detecting circuitry for defining at least one of the operation speed and timing of the sense amplifier, and circuitry responsive to an output of the operation defining circuitry and the sense amplifier activating signal for operating the sense amplifier at the defined operation speed and timing.

A method of operating the DRAM according to the present invention includes a step of changing the activating timing and/or sensing speed (the operation speed of the sense amplifier) of the sense amplifier depending on a rated value of the operation supply voltage.

The operation defining circuitry according to the present invention defines at least one of the operation speed and timing of the sense amplifier depending on the operation supply voltage. It is known that as a charge/discharge speed decreases in the operation of the sense amplifier, a sensitivity of the sense amplifier increases. Furthermore, as a sense starting time is delayed, a read-out voltage value becomes larger. Therefore, if one of the operation speed and timing of the sense amplifier is made varied depending on the rated value of the supply voltage, the sensitivity of the sense amplifier and/or the read voltage is improved, even with the lowered operation supply voltage. Thus, reliable sensing and amplifying of the memory cell data is obtainable, so that a normally functioning DRAM can be obtained even if a plurality of rated voltages are set for the operation supply voltage.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a diagram illustrating a relation between a control signal (a sense amplifier activating timing/speed defining signal) and a supply voltage when rated values of the supply voltage and an operation speed and/or operation timing of the sense amplifier are each varied according to operation mode.

FIG. 11 is a schematic diagram illustrating the circuit configuration for implementation of the operation waveform shown in FIG. 10.

FIG. 14 is an operation waveform diagram of the case of a normal operation (the supply voltage is 5 V), and FIG. 15 is a signal waveform diagram illustrating the operation at a lowered supply voltage.

DESCRIPTION OF THE PREFERRED EMBODIMENTS

First of all, a principle for supporting the present invention will now be described before describing the embodiments of the present invention.

High speed operability is not so desired in the above described sound data processing field employing a dry battery as a voltage supply as it is in the computer field. Normally, desired functions can sufficiently be achieved by an access (cycle) time of 1-10 μs in the sound data processing field. Therefore, obstacles to the lower supply voltage due to the access (cycle) time are removed in the sound data processing field.

The next problem in lowering of the supply voltage of the DRAM is concerned with amplification of the memory cell data. However, this problem is related to the above described high speed operability of the DRAM, so that if the high speed operability is not desired, the problem of amplification of the memory cell data can be solved as follows. First, in order to fully understand the principle of the present invention, the sense operation from the time t3 to the time t5 in the operation waveform diagram shown in FIG. 4 need be described in detail.

Figure 4:
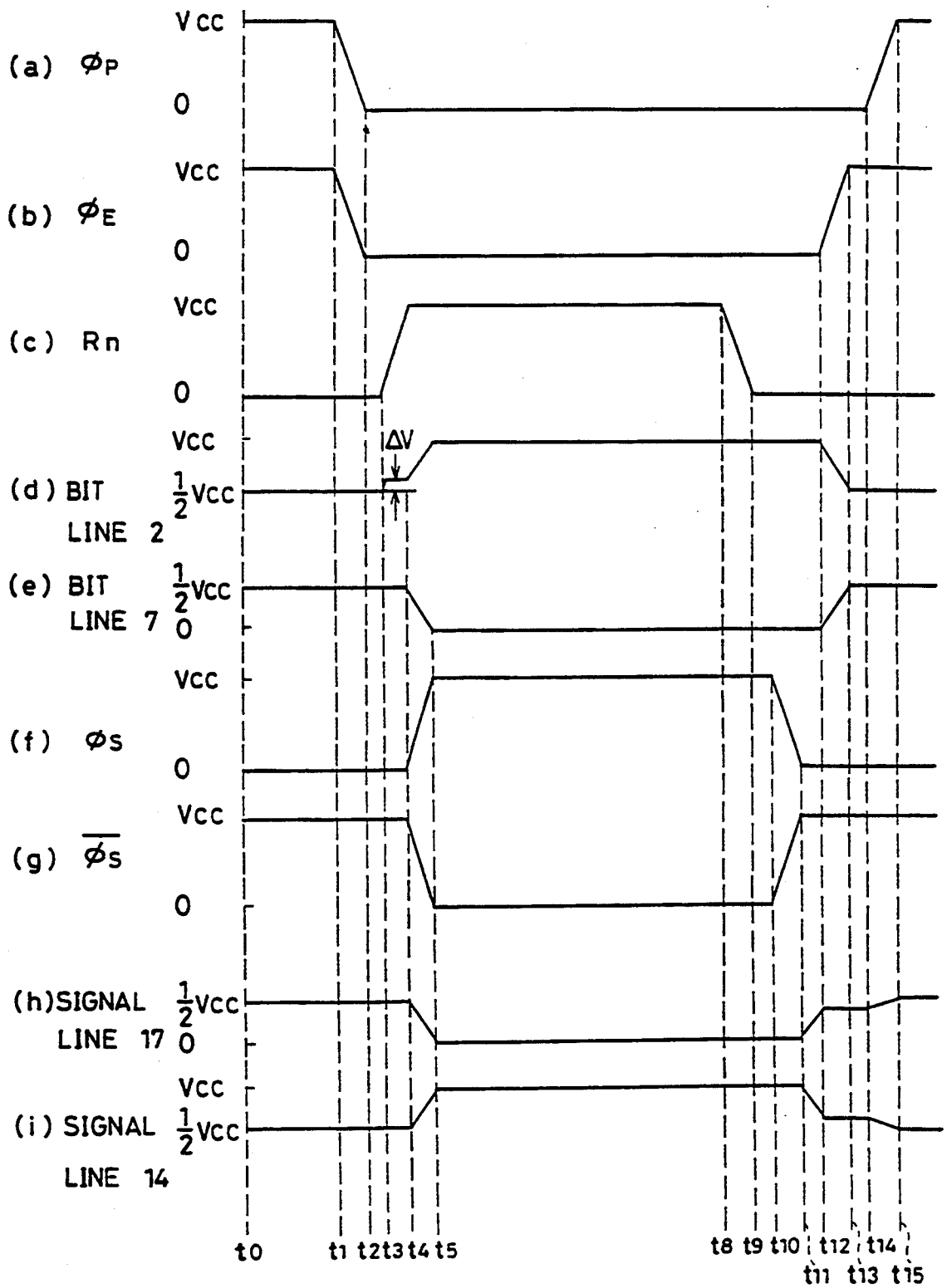
FIG. 4 is a signal waveform diagram illustrating an operation of the circuit configuration illustrated in FIG. 3.
Figure 5:
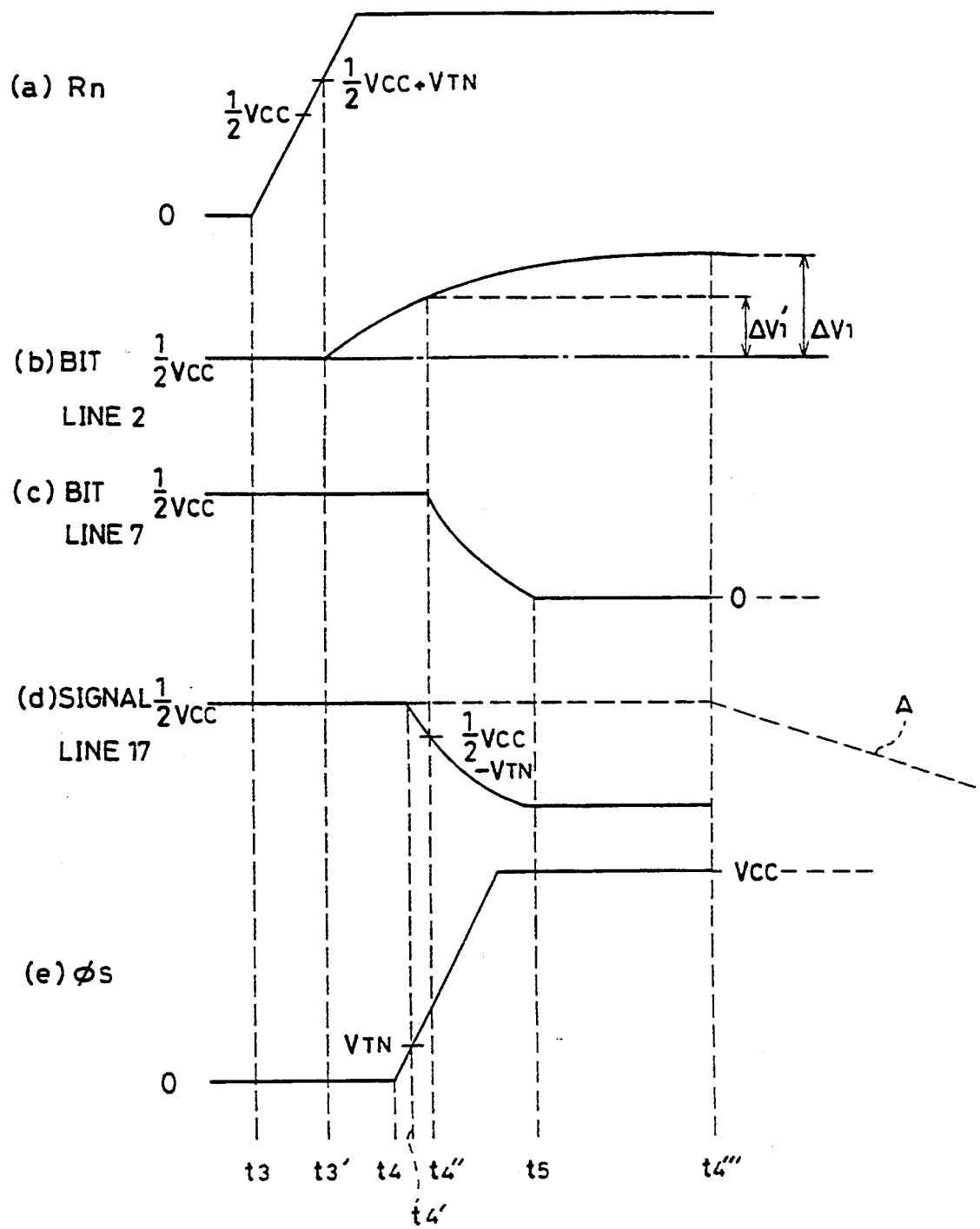
FIG. 5 is a diagram illustrating in detail a magnified operation waveform upon memory cell data reading in the operation of the circuit configuration shown in FIG. 3.

FIG. 5 illustrates an enlarged operation waveform from the time t3 to the time t5 of FIG. 4. The operations of raising the level of the bit line 2 to the supply potential $V_{cc}$ level is not described in FIG. 5 to avoid complexity; however, in the case that a sense operation is also carried out for the operation of raising the bit line level to the supply voltage $V_{cc}$ level the same discussion , holds as the one to be described in the following.

Referring to FIG. 5, the word line driving signal Rn starts rising at the time t3, and then when the potential level of the signal goes higher than the potential of the bit line 2 by a threshold voltage $V_{TN}$ of the n-FET 5 at the time t3', the n-FET starts conducting. Accordingly, a charge starts flowing from the storage node 4 to the bit line 2, and the potential on the bit line 2 starts rising.

As the potential of the word line driving signal Rn rises, the n-FET 5 is rendered further conductive (namely, it is deeply turned on), and the potential on the bit line 2 further rises. The potential on the bit line 2 rises with time elapsing, and finally rises higher than the precharge level thereof by a voltage $\Delta V1$ represented by the following value.

$$\Delta V1 = C6 \cdot V_{cc}/2(C6+C20) \tag{1}$$

It should be noted that in the operation waveform diagram in FIG. 5, the potential on the bit line 2 is illustrated larger than those of the other signals so as to show more clearly the change of the potential.

In the above described expression (1), the C6 represents a capacitance value of the memory cell capacitor 6, the C20 represents a capacitance value of the parasitic capacitance 20 of the bit line 2, and the $V_{cc}$ is the supply voltage.

When the sense amplifier activating signal $\phi_S$ starts rising and its level rises by the threshold voltage $V_{TN}$ of the n-FET 25 at the time t4, the n-FET 25 starts conducting and the potential on the signal line 17 starts falling at the time t4'.

When the potential on the signal line 17 falls lower than the $V_{cc}/2$ by a threshold voltage $V_{TN}$ of the n-FET 19 at the time t4, the sense amplifier 50 initiates amplifying operation. In this case, the potential on the side of the bit line 2 is $\Delta V1'$ higher than the $V_{cc}/2$, while the side of the potential on the bit line 7 is $V_{cc}/2$. Therefore, the potential on the bit line 2 is higher than the potential on the bit line 7 by the potential $\Delta V1'$. Due to the amplification of the voltage difference by the activated sense amplifier 50, the potential on the bit line 7 is discharged via the n-FET 19 and falls in accordance with falling of the potential on the signal line 17, and becomes 0 V at the time t5. That is, the small voltage difference $\Delta V1'$ is amplified by the sense amplifier 50.

The important point of this operation is how to ensure a large voltage difference $\Delta V1'$ at the time t4" to start the operation of the sense amplifier 50. When the voltage difference (a read-out voltage of the memory cell data) $\Delta V1'$ is small, the sense amplifier 50 performs erroneous operation.

An ideal state of amplification is obtained in the case that the respective parasitic capacitances 20 and 21 of the bit Lines 2 and 7 have the same capacitance value, an electrical noise voltage on the bit lines 2 and 7 coupled from the other bit lines are the same, and n-FET 18 and the n-FET 19 have the same electrical element parameter (e.g. a threshold voltage). In this case, the sense amplifier 50 can normally sense and amplify even an extremely small voltage difference of, e.g. 1 mV. However, such requirements for the ideal state for amplification are not satisfied in practice, but some imbalancing state takes place, so that a potential difference of several 10 mV is required for the sense amplifier 50 to sense and amplify the voltage difference. Consequently, a certain period of time is required for the period from the time t3' to the time t4" in order to obtain this required minimum voltage difference $\Delta V1'$.

As has been described above, the longer this required time is, the larger an input voltage difference to the sense amplifier 50 grows, resulting ill a stable operation of the sense amplifier 50. However, as a matter of course, as this required time becomes longer, the time period for reading data from a memory cell becomes longer, and thus both of the access time and cycle time become longer. Therefore, this required time is set to be approximately within 10–15 ns in a common DRAM (the access time of 80–120 ns).

Furthermore, a case that the supply voltage $V_{cc}$ is lowered will be considered with reference to FIG. 5. As seen from the expression (1), since the voltage difference $\Delta V1$ is in proportion to the supply voltage $V_{cc}$, the voltage difference $\Delta V1'$ becomes smaller accordingly, so that the sense amplifier 50 is liable to perform erroneous operations.

Assuming that the time for operating the sense amplifier 50 (the sense starting time) is delayed to be set at the time when the potential on the bit line 2 is close to the final level (that is, the time $t4'''$ in FIG. 5), the input voltage difference to the sense amplifier 50 can be increased, and therefore the value of the supply voltage $V_{cc}$ can be decreased.

In a normal DRAM, if the time period from the time $t3'''$ to the time $t4'''$ is set within the time period of 50 to 100 ns, a potential rise of $\Delta V1$ at almost the final level can occur on the bit line 2 at the time $t4'''$. Such a long time period is not allowed in the application of the normal DRAM; however, when it is employed in the sound data processing field employing the lower supply voltage as described above, the required access time (cycle time) is of the order of a microsecond, so that no problem arises even if the time period from the time $t3'$ to the time $t4'''$ is set to be within 50–100 ns, and thus the desired performance can fully be achieved.

The relation between the voltage difference $\Delta V1$ and $\Delta V1'$ will be considered in further detail. In a DRAM, in general, the time $t4''$ is set at the time when the voltage difference $\Delta V1'$ attains a value of 70–80% of the voltage difference $\Delta V1$, and the sense operation of the sense amplifier initiates at the time $t4''$. It means that when the time $t4''$ is delayed to the time $t4'''$, the supply voltage required for assuring the same input voltage difference to the sense amplifier 50 may be lowered by 70–80%. That is, a supply voltage of 3.5–4.0 V is obtained as 70–80% of the supply voltage 5 V. Therefore, in the case that the batteries are employed as the voltage supply, if the sense operation of the sense amplifier is set to start at the time $t4'''$, it becomes possible to perform sensing and amplifying of the memory cell data without any errors.

In the case of the lower supply voltage as described above, a solution to the problem concerning with the reliable sensing and amplifying of the memory cell data can be attained by delaying the time for activating the sense amplifier, but is not sufficient yet.

An improved method of the reliable sensing and amplifying of the memory cell data is to improve sensitivity of the sense amplifier 50 by reducing a potential falling speed of the signal 17, as shown by the broken line A in FIG. 5. The broken line of the potential on the signal line 17 in FIG. 5 indicates a potential change caused when the sense starting time of the sense amplifier is set at the time $t4'''$. It is generally known that the sensitivity of the sense amplifier 50 is improved by reducing the potential falling speed on the signal line 17 (refer to Nikkei Electronics, Jan. 8, 1979, pp. 110–133). Therefore, reduction in the potential falling speed on the signal line 17 and in the operating speed of the sense amplifier allows the sensitivity of the sense amplifier to improve and the supply voltage to fall to 3.6 V. As the potential falling speed decreases, the sensitivity of the sense amplifier is more improved; however, the sensitivity becomes substantially saturated at a falling speed requiring approximately 100 ns from the starting time to the ending time of the potential falling. This invention is made to cope with the lowered supply voltage of the DRAM according to the above described method. The embodiments of the present invention will hereinafter be described with reference to the drawings.

Figure 6:
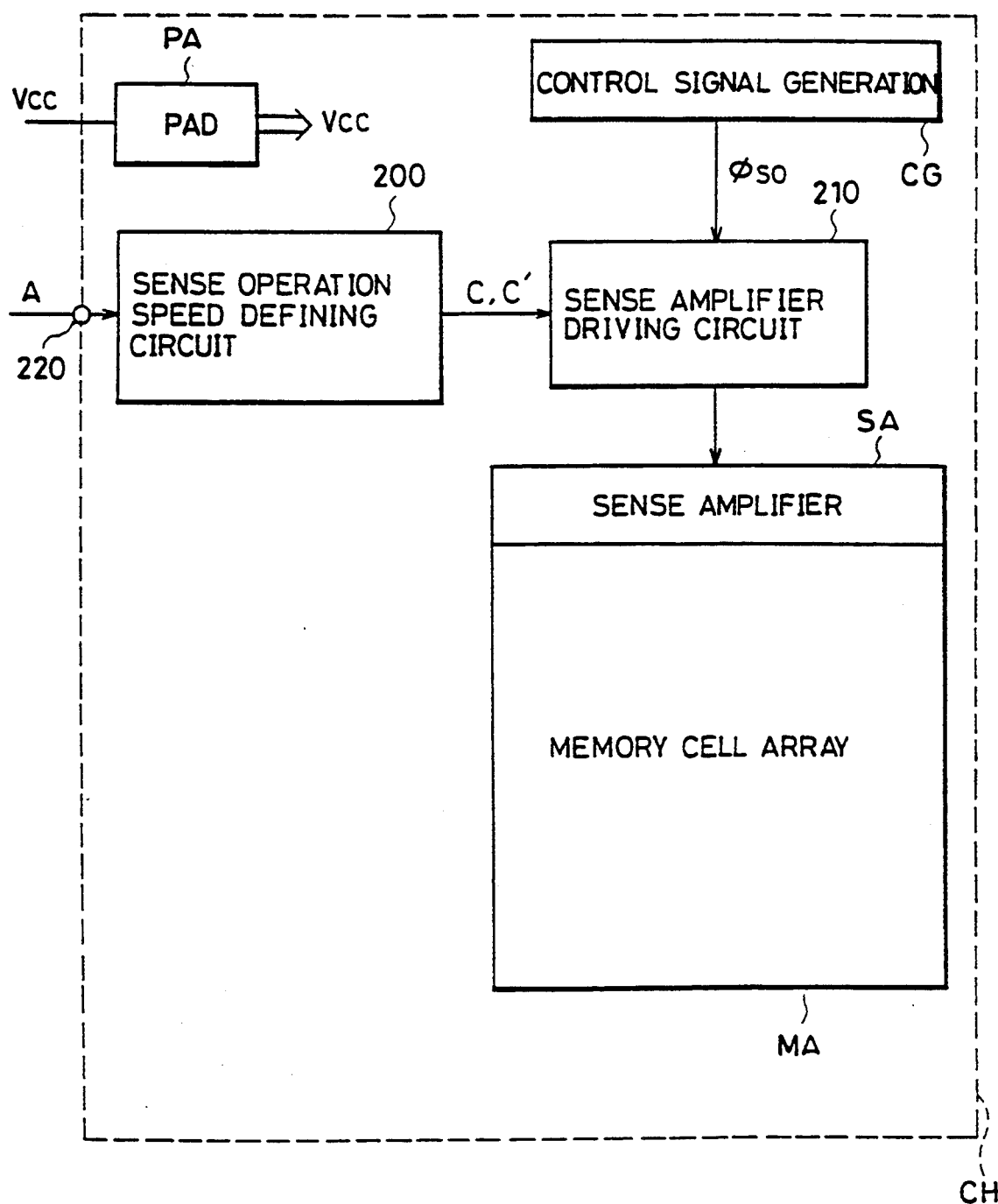
FIG. 6 is a schematic diagram illustrating a configuration of a major portion of a DRAM according to one embodiment of the present invention.

FIG. 6 illustrates a schematic configuration of the DRAM according to one embodiment of the present invention. The configuration shown in FIG. 6 only illustrates a circuit portion of driving the sense amplifier. Referring to FIG. 6, the DRAM includes a sense operation speed defining circuit 200 and a sense amplifier driving circuit 210.

The sense operation speed defining circuit 200 is responsive to an operation speed instructing signal A externally applied via a terminal 220 for generating signals C and C' for defining at least one of the operation speed and operation timing of the sense amplifier SA. The operation speed instructing signal A is externally applied according to rated values of an external supply voltage applied to a pad PA, and defines the operation speed and timing of the sense amplifier according to the rated values of this supply voltage.

The sense amplifier driving circuit 210 drives the sense amplifier SA in response to a sense amplifier activating signal $\phi_{SO}$ generated at a predetermined timing (which is provided by delaying the signal $\overline{RAS}$ by a predetermined time period) from a peripheral circuit CG for control signal generation, and to the operation speed and timing defining signals C and C' from the sense operation speed defining circuit 200. The sense amplifier SA is activated at the timing defined by the defining signals C and C' and operates at a defined operation speed.

Figure 7:
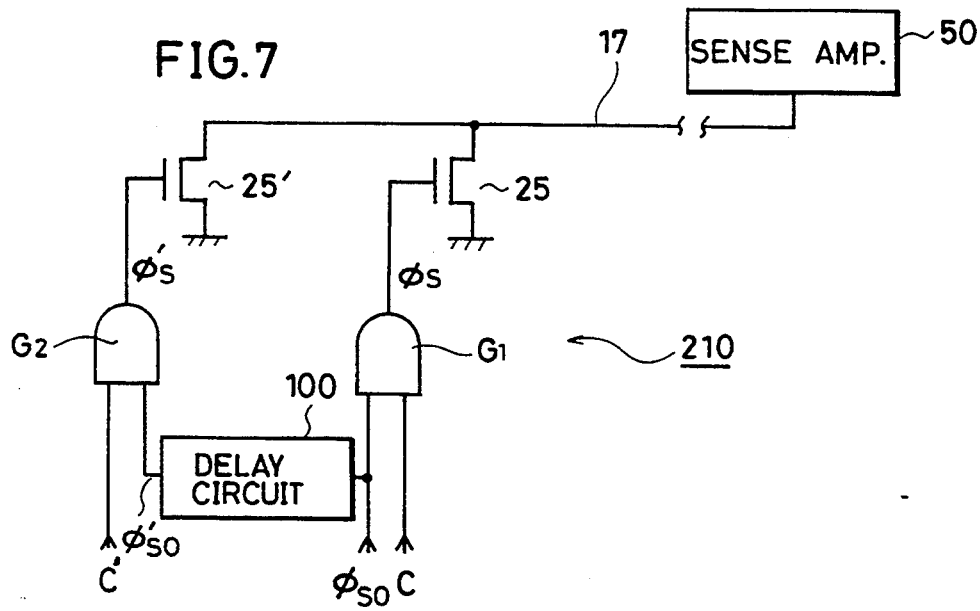
FIG. 7 is a diagram illustrating one example of the detailed configuration of a sense amplifier driving circuit shown in FIG. 6.

FIG. 7 illustrates one example of a detailed configuration of the sense amplifier driving circuit 210. Referring to FIG. 7, the sense amplifier driving circuit 210 includes an AND gate G1 for receiving the defining signal C from the operation speed defining circuit 200 and the sense amplifier activating signal $\phi_{SO}$, a delay circuit 100 for delaying the sense amplifier activating signal $\phi_{SO}$ by a predetermined time period, and an AND gate G2 for receiving the operation defining signal C' and the sense amplifier activating signal $\phi'_{SO}$ from the delay circuit 100. A signal line 17 is provided with n-FETs 25 and 25' for activating a sense amplifier 50. The n-FET 25 has its gate supplied with a first sense amplifier driving signal $\phi_S$ from the AND gate G1. The n-FET 25' has its gate supplied with a second sense amplifier driving signal $\phi'_S$ from the AND gate G2. An operation will be described.

The defining signal C attains "1" when the supply voltage of 5 V is applied to the pad PA, while the defining signal C' attains "1" when the rated value of the supply voltage is below 5 V. Under standard supply voltage operation ($V_{cc}=5$ V), the defining signal C is "1" and the defining signal C' is "0". In this case, the AND gate G1 is rendered to be at an enable state, while the AND gate G2 is rendered to be at a disable state. Therefore, when the sense amplifier activating signal $\phi_{SO}$ is generated from the peripheral circuit CG for control signal generation at the normal timing, the sense amplifier driving signal $\phi_S$ is generated at the normal operation timing via the AND gate G1, and the n-FET 25 starts conducting, and accordingly, the sense amplifier 50 is activated to carry out sensing and amplifying operations of the memory cell data.

When the rated value of the supply voltage applied to the pad PA is low ($V_{cc} < 5$ V) the defining signal C goes to "0" and the defining signal C' goes to "1". Accordingly, the AND gate G1 is rendered to be at the disable state, while the AND gate G2 is rendered to be at the enable state. Therefore, the n-FET 25' starts conducting responsive to the delay sense amplifier driving signal $\phi'_{SO}$ generated from the delay circuit 100, thereby carrying out the sensing and amplifying operation of the sense amplifier 50. In this case, the delay circuit 100 provides a delay time of 50–100 ns. Therefore, after a sufficient time has elapsed since selection of a memory cell, differential amplification of the potential between the bit lines in respective pairs, i.e., amplification of the memory cell data is performed. As a result, even if the rated value of the supply voltage is small, the sense amplifier 50 performs a stable operation, so that correct sensing and amplifying of the memory cell data can be performed.

Also in this case, the "H" level of the sense amplifier activating signals $\phi_S$ and $\phi'_S$ generated from the AND gates G1 and G2 are normally the supply voltage $V_{cc}$ level. Therefore, when the rated value of the supply voltage is small, the "H" level thereof is also at a reduced potential. Accordingly, when the rated value of the operation supply voltage is low, the n-FET 25' is lightly turned on (compared to the case that the supply voltage is 5 V), and a longer time is required for discharging the signal line 17, so that the operation speed of the sense amplifier 50 decreases and thus the sensitivity of the sense amplifier is improved.

The n-FETs 25 and 25' are provided for carrying out discharging of the signal line 17 according to rated values of the supply voltage in the configuration of the sense amplifier driving circuit shown in FIG. 7. However, it is possible to achieve the driving of the sense amplifier according to the rated value of the supply voltage by employing only one n-FET. The described configuration is illustrated in FIG. 8.

Figure 8:
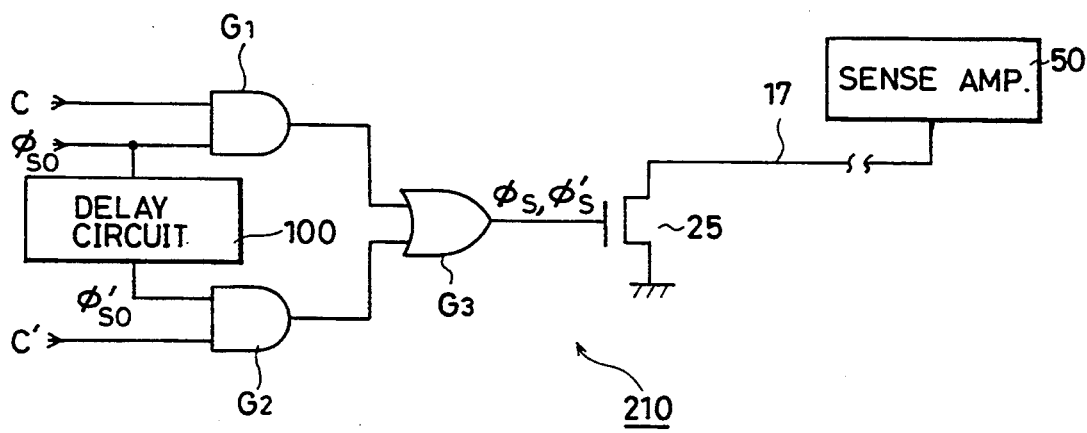
FIG. 8 is a diagram illustrating another example of the detailed configuration of the sense amplifier driving circuit shown in FIG. 6.

Referring to FIG. 8, the sense amplifier driving circuit 210 includes an OR gate G3 for receiving outputs of the AND gates G1 and G2. An output of the OR gate G3 is supplied to the gate of the n-FET 25. The delay circuit 100 and the AND gates G1 and G2 are configured in the same manner as shown in FIG. 7. In this configuration of FIG. 7, the OR gate G3 passes the sense amplifier driving signals $\phi_S$ and $\phi'_S$ applied from the AND gates G1 and G2. Therefore, also in the configuration shown in FIG. 8, the operation timing of the n-FET 25 can be varied depending on the rated values of the supply voltage, resulting in the same effect as that of the configuration shown in FIG. 7.

Figure 1:
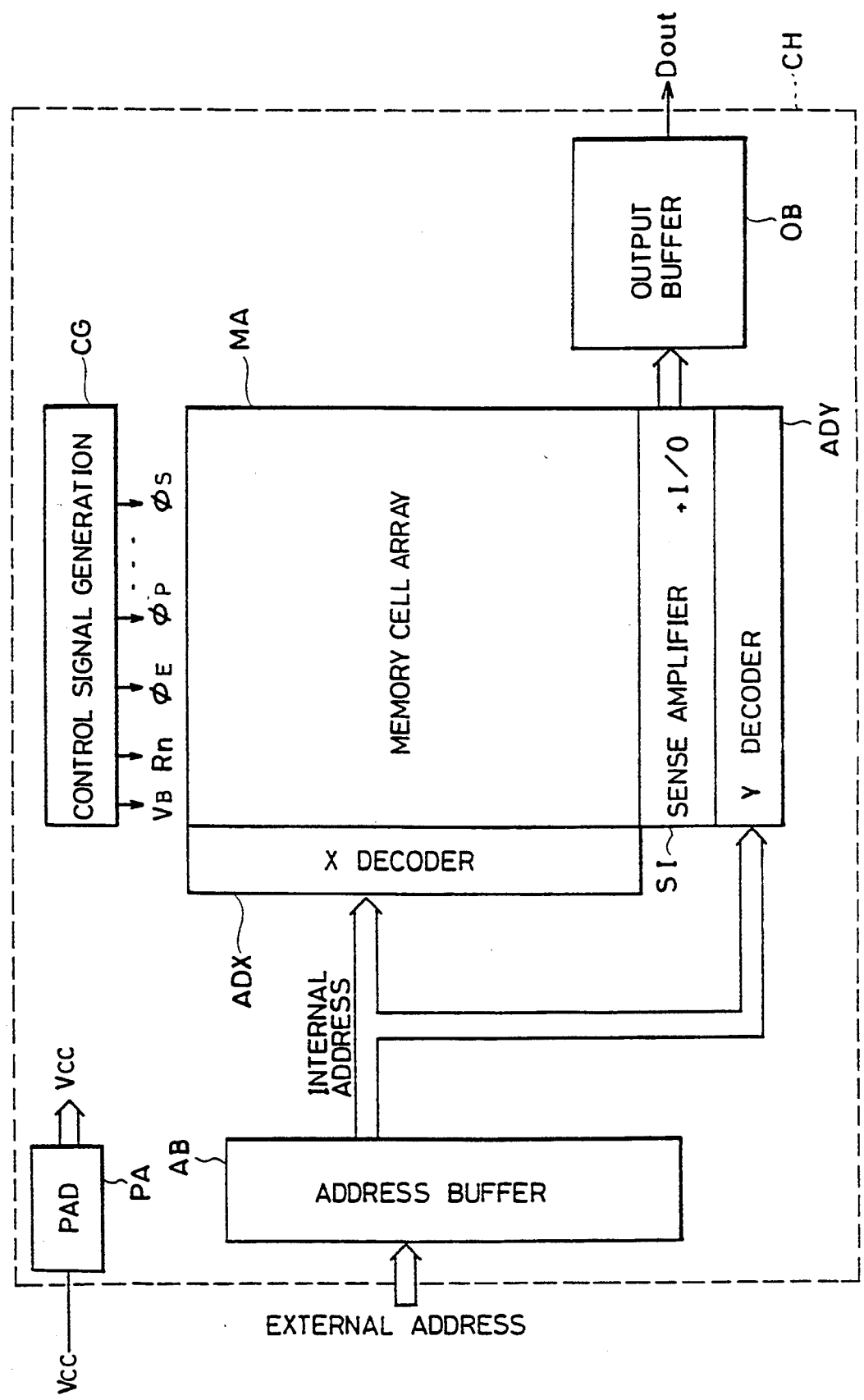
FIG. 1 is a schematic diagram of the entire configuration of a conventional DRAM.
Figure 2:
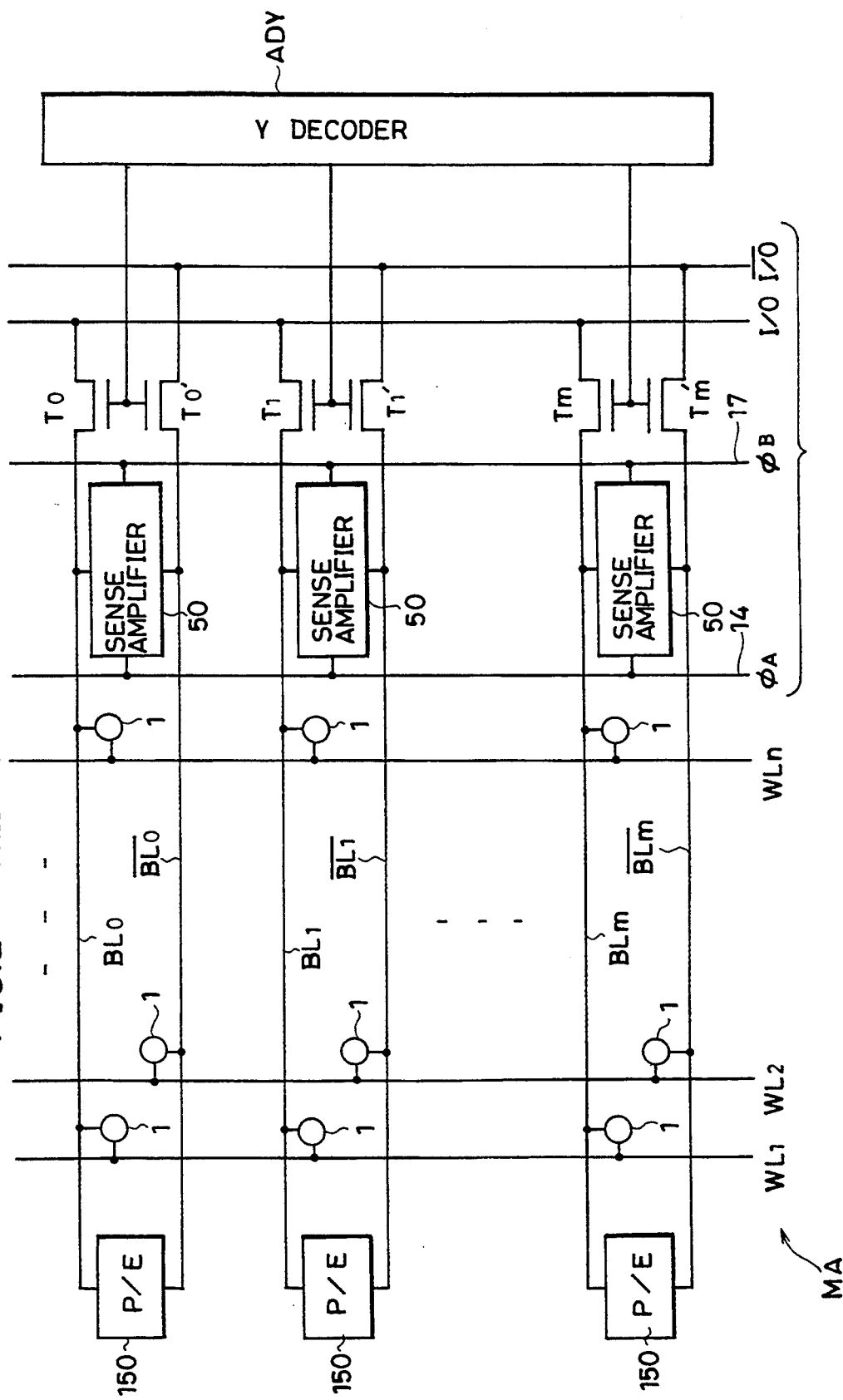
FIG. 2 is a schematic diagram of the configuration of a memory cell array portion and a related circuit thereto of the conventional DRAM.
Figure 3:
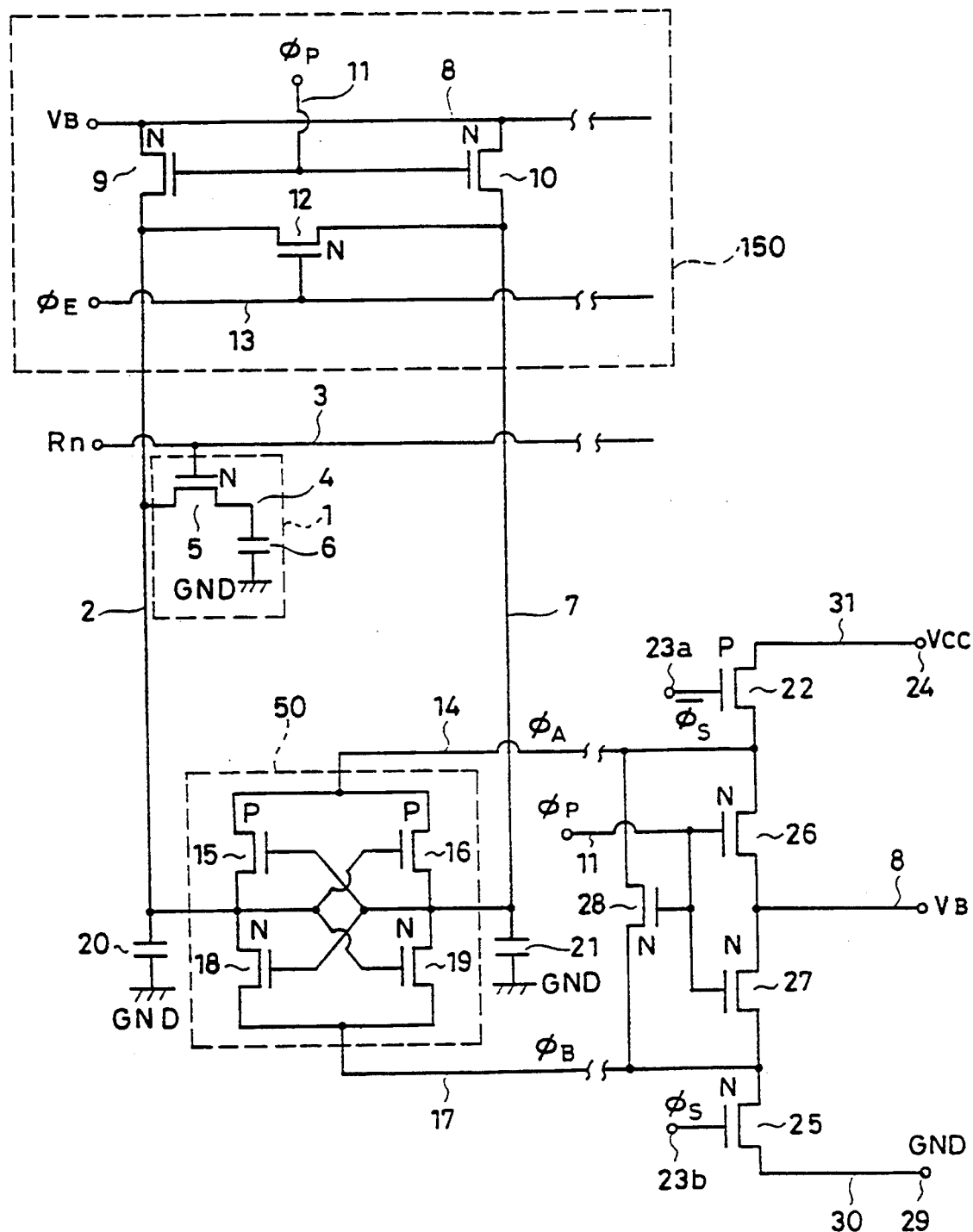
FIG. 3 is a diagram illustrating in detail the configuration of a pair of bit lines and a sense amplifier associated therewith, and the configuration of a sense amplifier driving circuit.

In addition, a control only over the starting time for driving the sense amplifier is considered in the configurations shown in FIGS. 7 and 8. However, a method of further decreasing the potential falling speed on the signal line 17 may be added to these configurations as described above. For such configurations, the configuration shown in FIG. 2 may be employed that the n-FET 25' of large resistance is used to reduce the discharging speed of the signal line 17 therethrough.

Figure 9:
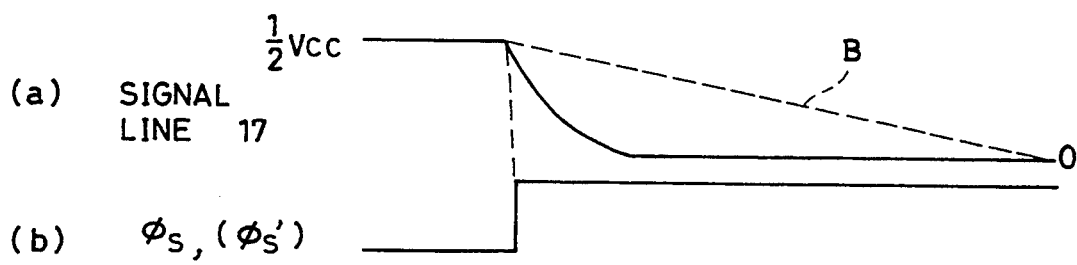
FIG. 9 is a schematic diagram illustrating a potential change in a sense amplifier activating signal line at a slower operation of the sense amplifier.

Furthermore, in the case of coping with the lowered supply voltage only by varying the potential falling speed on the signal line 17, such configuration may be employed excluding the delay circuit 100 from FIG. 7 that the resistance of the n-FET 25' is increased. In this case, when the time required for discharging the signal line 17 is, for example, 100 ns, the order of the resistance of the n-FET 25' is 100 kΩ. By this configuration, the discharging speed on the signal line 17 is decreased as shown by the broken line B in FIG. 9, so that the improved sensitivity of the sense amplifier 50 and the stable operation of the sense amplifier can be achieved.

As means for supplying the defining signals C and C', a simple method is considered that a dedicated external lead terminal is provided on the semiconductor chip CH to supply a signal A for changing the operation speed and timing depending on the rated values of the supply voltage. According to this method, the sense operation speed defining circuit 200 is, for example, formed of inverters of two stages connected in cascades, as shown in FIG. 6. The defining signals C and C' can be obtained by deriving an output signal from each of the inverters of two stages.

The foregoing description illustrates such a method that the rated value of the supply voltage is set at first, thereby carrying out correct data reading/writing operations of the DRAM depending on that sen value of the supply voltage. However, in the case that the DRAM is employed as a memory device for a general computer, the DRAM is sometimes employed merely for holding data except in data reading/writing. It means that the DRAM only performs a refresh operation in this case. A cycle time in this refresh operation is normally set to 15.6 μs, and thus does not need a fast operation. Therefore, during the refresh cycle which does not need the fast operation as described above, the delayed operation timing and the decreased operation speed of the sense amplifier can cause the decreased supply voltage and decreased power consumption of a memory system. That is, the decreased power consumption is realized by varying the supply voltage according to the operation mode of the DRAM, and by varying the operation timing and operation speed of the sense amplifier depending on the varied supply voltage. The configuration thereof will hereinafter be described. FIG. 10 illustrates a relation between a control signal and the supply voltage in a configuration that the rated values of the supply voltage are varied according to the operation mode, and accordingly the operation speed and operation timing of the sense amplifier are also varied.

As shown in FIG. 10, normal data reading/writing operations are carried out from the time T0–T1. These operations need be carried out at a high speed, so that the supply voltage $V_{cc}$ is set to 5 V, and accordingly the defining signals C' and C are respectively set to "0" and "1". Further, the sense amplifier also operates at high speed.

The period from the time T1–T2 is only for data holding operation. In this operation, the defining signals C' and C are respectively set to "1" and "0" immediately before the time T1, so that the sense amplifier operates at a lower speed, and then the supply voltage $V_{cc}$ falls to 3.6 V. Accordingly, the DRAM is rendered operable at a lower supply voltage and thus operates in decreased power consumption.

When the normal data reading/writing are again carried out from the time T2, the supply voltage $V_{cc}$ is raised from 3.6 V to 5 V immediately before the time T2, and then the defining signals C' and C are respectively set to "0" and "1", resulting in the fast operation of the sense amplifier.

At this timer the signals C and C' need be generated for defining the operation speed/timing of the sense amplifier according to the operation mode of the DRAM. Although the change in the rated values of the supply voltage is made externally, e.g. by a CPU (not shown), a signal for supplying a timing to switch the operation of the sense amplifier is similarly generated in response to the signal for defining this operation mode.

FIG. 11 shows a configuration of switching the state of the signals C and C' for defining the operation of the sense amplifier according to the operation mode of the DRAM as described above.

Referring to FIG. 11, a timing detecting circuit 130 receives a column address strobe signal $\overline{CAS}$ applied via an input terminal 81, a row address strobe signal $\overline{RAS}$ via an external terminal 82 and a write signal $\overline{W}$ applied via an external terminal 83 so as to generate a signal T for defining the operation mode according to the timings of these received signals.

The timing detecting circuit 130 generates a mode instructing signal T when the transition timings of the column address strobe signal $\overline{CAS}$, the row address strobe signal $\overline{RAS}$ and the write signal $\overline{W}$ differ from the normal timings. For example, in the case that the write signal $\overline{W}$ and the row address strobe signal $\overline{RAS}$ both fall to the "L" level after the column address strobe signal $\overline{CAS}$ falls to the "L" level, the instructing signal T is generated. As for another timing, the signal T is generated in the $\overline{CAS}$ before $\overline{RAS}$ and write state as in an auto-refresh operation, for example. A switching signal generating circuit 120 generates the defining signals C and C' in response to the mode instructing signal T from the timing detecting circuit 130 and an external address signal A0 applied via an external terminal P0. Since the external address pin P0 is unused in the data holding operation mode, the address input pin terminal P0 is employed as an input terminal for a sense amplifier operation defining and instructing signal. The switching signal generating circuit 120 generates the defining signals C and C' to be "0" and "1", respectively, in response to the signal T when the external address signal A0 is at the "H" level.

Figure 12:
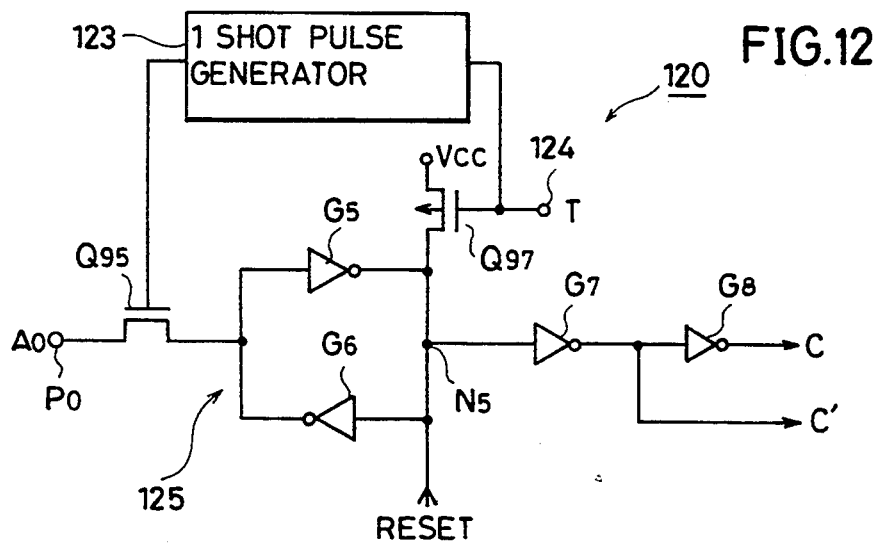
FIG. 12 is a diagram illustrating one example of the detailed configuration of a switching signal generating circuit shown in FIG. 11.

FIG. 12 shows one example of the configuration of the switching signal generating circuit 120 shown in FIG. 11. Referring to FIG. 12, the switching signal generating circuit 120 comprises an n-FET Q95, a p-FET Q97, inverters G5–G8 and a one shot pulse generating circuit 123.

The one shot pulse generating circuit 123 generates a pulse of positive polarity with a predetermined pulse width in response to a mode instructing signal T applied via a terminal 124. The n-FET Q95 is turned on responsive to a pulse signal from the one shot pulse generating circuit 123 to pass therethrough an address signal A0 applied via a terminal P0. The inverters G5 and G6 constitute a latch circuit 125 to latch the address signal A0 applied via the n-FET Q95.

The p-FET Q97 is turned on when an operation mode instructing signal T applied via the terminal 124 is at the "L" level so as to charge a node N5 at an output portion of the latch circuit 125 to the supply voltage $V_{cc}$ level. The output node N5 of the latch circuit 125 is provided with the inverters G7 and G8 of two stages connected in cascade. A defining signal C' is outputted from the inverter G7, and a defining signal C is outputted from the inverter G8. The operation thereof will now be described.

The signal T is at the "L" level in data reading/writing operation mode during the normal operation in which the supply voltage $V_{cc}$ is 5 V. Accordingly, an output of the one shot pulse generating circuit 123 is at the "L" level, and the n-FET Q95 is off. Meanwhile, the p-FET Q97 is on, so that the output node N5 in the latch circuit 125 is fixed to the "H" level of the supply voltage $V_{cc}$ level. As a result, the defining signal C' outputted from the inverter G7 falls to the "L" level, while the defining signal C outputted from the inverter G8 rises to the "H" level. Consequently, the sense amplifier operates at high speed as described above.

The signal T changes from the "L" level to the "H" level in the lowered supply voltage operation such as in data holding operation mode. A one shot pulse of positive polarity is generated from the one shot pulse generating circuit 123 in response to this change in the levels of the signal T, so that the n-FET Q95 is turned on. On the other hand, the p-FET Q97 is off. If the address signal A0 is applied to the external pin terminal p0 at this time, the applied address signal A0 is accepted into the latch circuit 125 to be latched. When the address signal A0 is at the "H" level, the potential on the output node N5 falls to the "L" level, and accordingly the defining signals C' and C go to the "H" level and the "L" level, respectively. Consequently, the operation timing and operation speed of the sense amplifier are decreased.

However, if the address signal A0 is at the "L" level, the output node N5 of the latch circuit 125 is at the "H" level, and the defining signals C and C' remain at the "H" level and the "L" level, respectively, thereby to keep the same state as in the normal operation.

The output node N5 of the latch circuit 125 is reset responsive no a reset signal Reset generated, for example, when the power supply is turned on or recovered to 5 V, and set to the "L" level in the 5 V power supply operation and immediately after the power supply is turned on.

Figure 13:
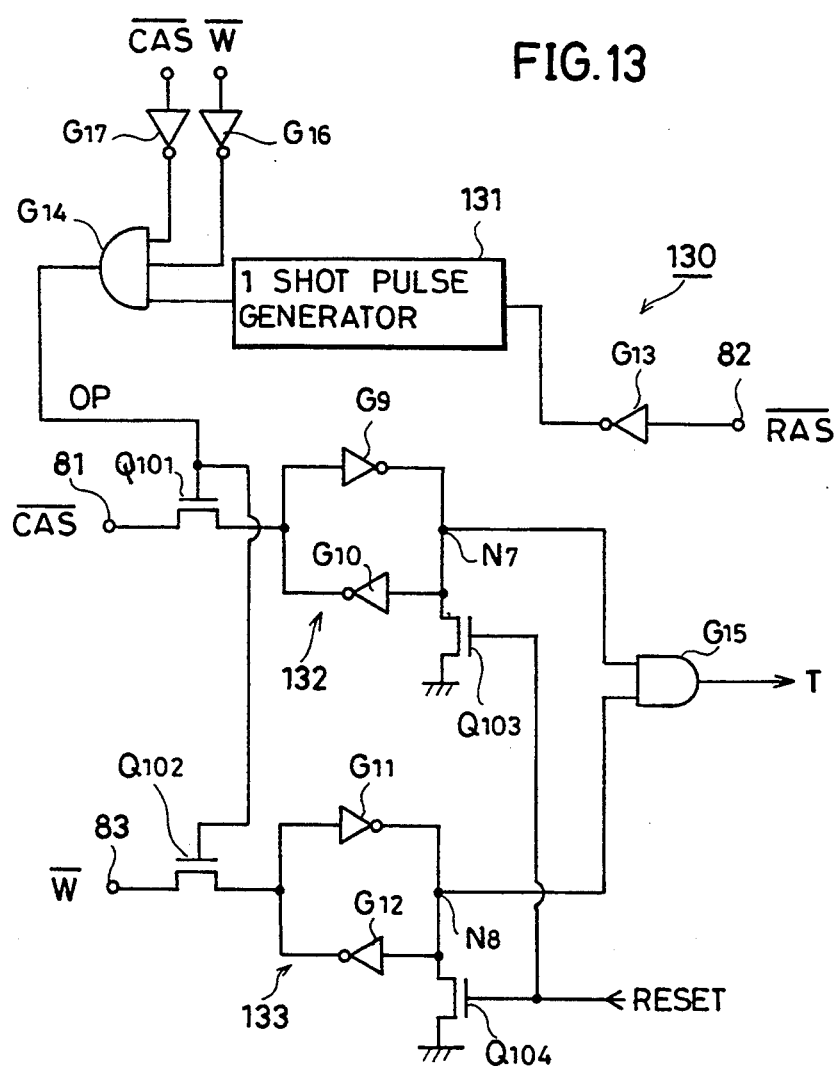
FIG. 13 is a diagram illustrating one example of the detailed configuration of a timing detecting circuit shown in FIG. 11.

FIG. 13 illustrates one example of the detailed configuration of the timing detecting circuit 130 in FIG. 11.

Referring to FIG. 13, the timing detecting circuit 130 comprises n-FETs Q101–Q104, inverters G 9–G13, and G17, AND gates 14 and 15 and a one shot pulse generating circuit 131.

The one shot pulse generating circuit 131 receives via the inverter G13 a row address strobe signal $\overline{RAS}$ applied via an external terminal 82 so as to generate a one shot pulse of positive polarity with a predetermined pulse width in response to shifting of the signal $\overline{RAS}$ to the "L" level (shifting of the output of the inverter Q13 to the "H" level).

The AND gate G14 receives a column address strobe signal $\overline{CAS}$ and a write instructing signal $\overline{W}$ via the respective inverters G17 and G16 and also receives an output from the one shot pulse generating circuit 131. Therefore, the AND gate G14 passes therethrough the one shot pulse from the one shot pulse generating circuit 131 when the signals $\overline{CAS}$ and $\overline{W}$ are both at the "L" level.

The n-FET Q101 is turned on responsive to a one shot pulse OP from the AND gate G14 so as to pass the signal $\overline{CAS}$ from the external terminal 81. The n-FET Q102 is turned on responsive to the one shot pulse OP from the AND gate G14 so as to pass the signal $\overline{W}$ applied via an external terminal 83.

The inverters G9 and G10 constitute an inverter latch 132 to latch an output of the n-FET Q101. The inverters G11 and G12 constitute an inverter latch 133 to latch an output of the n-FET Q102.

The AND gate G15 receives the respective outputs of the inverter latches 132 and 133 to output a mode instructing signal T.

Figure 14:
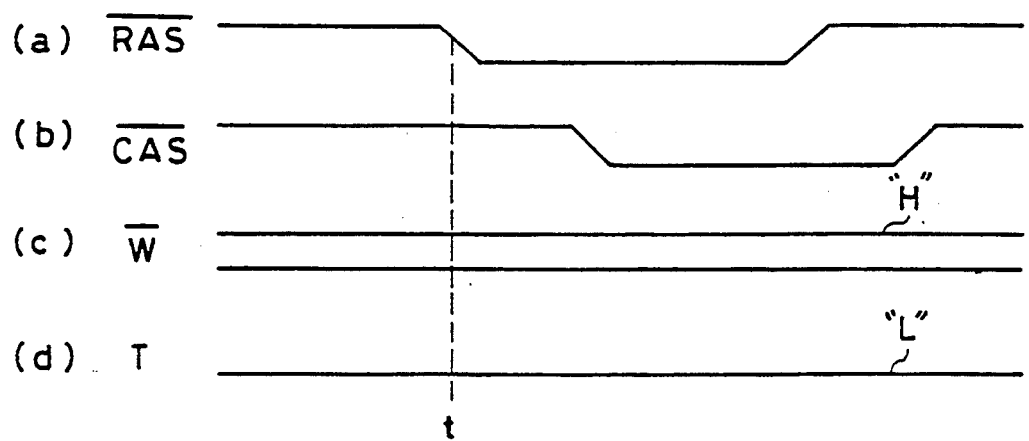
FIGS. 14 and 15 are signal waveform diagrams illustrating the operation of the timing detecting circuit shown in FIG. 13.

The inverter latches 132 and 133 are respectively provided with the n-FETs Q103 and Q104 which are turned on responsive to the reset signal Reset for setting the respective output nodes N7 and N8 to the ground potential GND level. Next, the operation of the timing detecting circuit 130 shown in FIG. 13 will be described with reference to FIGS. 14 and 15 which are operation waveform diagram thereof.

First of all, the n-FETs Q103 and Q104 are turned on responsive to the reset signal Reset immediately after the power supply is turned on or recovered to 5 V so as to set the potentials on the nodes N7 and N8 to the "L" level. Accordingly, the level of the signal T falls to the "L" level.

When the row address strobe signal $\overline{RAS}$ applied to the external terminal 82 falls to the "L" level, a one shot pulse is generated from the one shot pulse generating circuit 131. If the signal $\overline{CAS}$ and $\overline{W}$ are both already at the "L" level at this time, a one shot pulse OP is outputted from the AND gate G14. Accordingly, the n-FETs Q101 and Q102 are turned on. In response to this, the column address strobe signal $\overline{CAS}$ and the write instructing signal $\overline{W}$ applied to the respective external terminals 81 and 83 are accepted in the respective latch circuits 132 and 133.

In the normal data reading/writing operation of the DRAM, the column address strobe signal $\overline{CAS}$ is allowed to shift to the "L" level only after the row address strobe signal $\overline{RAS}$ falls to the "L" level. Therefore, in this normal data reading/writing operation mode (when the supply voltage $V_{cc}$ is 5 V), the column address strobe signal $\overline{CAS}$ and the write signal $\overline{W}$ are both at the "H" level at the time t when the row address strobe signal $\overline{RAS}$ falls to the "L" level. Accordingly, the one shot pulse OP is not generated from the AND gate G14, so that the n-FETs Q101 and Q102 are off. Therefore, the output nodes N7 and N8 of the inverter latches 132 and 133 are already kept at the "L" level in response to the reset signal Reset. Accordingly, a signal of the "L" level is outputted from the AND gate G15.

Additionally, in the normal operation mode of this case, the signals $\overline{CAS}$ and $\overline{W}$ shift to the "L" level in data writing. However, if the pulse width generated by the one shot pulse generating circuit 131 is set to a shorter time period than the period from the time when the signal $\overline{RAS}$ falls to the "L" level to the time when the signals $\overline{CAS}$ and $\overline{W}$ next fall to the "L" level, the n-FETs Q101 and Q102 are turned off and the signal T remains at the "L" level, as described above.

Figure 15:
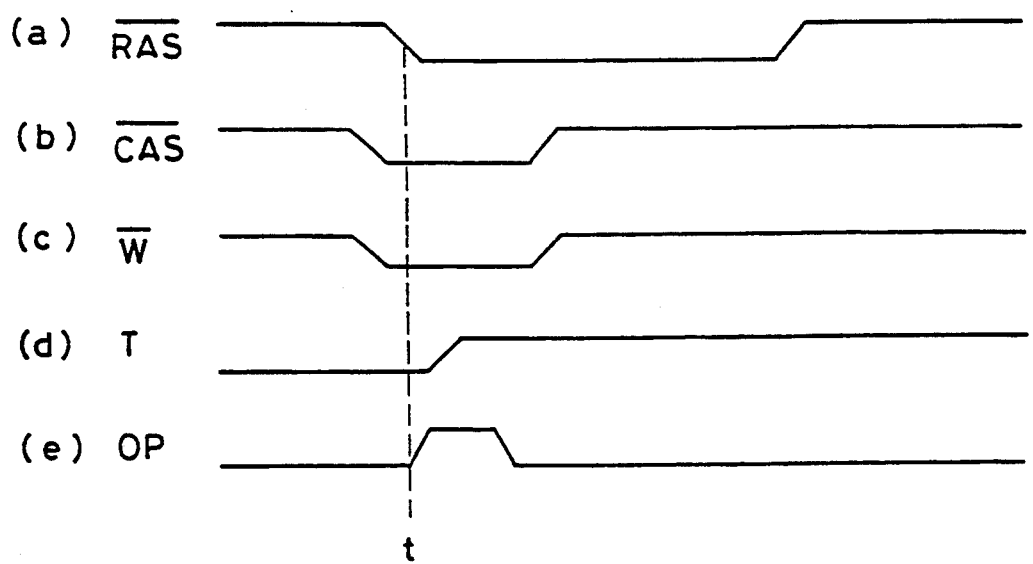

In the lowered supply voltage operation such as data holding, the signals $\overline{CAS}$ and $\overline{W}$ are set to the "L" level before the time t when the signal $\overline{RAS}$ falls to the level, as shown in FIG. 15. Accordingly, the pulse generated from the one shot pulse generating circuit 131 in response to the falling of the signal $\overline{RAS}$ passes through the AND gate G14 and is transmitted as the one shot pulse OP to the respective gates of the n-FETs Q101 and Q102. Therefore, the signals $\overline{CAS}$ and $\overline{W}$ applied to the respective external terminals 81 and 83 are accepted in the respective inverter latches 132 and 133 to be latched. Since the signals $\overline{CAS}$ and $\overline{W}$ are both at the "L" level, the potentials on the nodes N7 and N8 go to the "H" level, and the potential level of the timing detecting signal T generated from the AND gate G15 also rises to the "H" level. As a result, the operation timing and the operation speed of the sense amplifier are set to those corresponding to the lower supply voltage.

Recovery from this lowered supply voltage operation to the normal data reading/writing operation mode is achieved by generating a reset pulse Reset.

Figure 16:
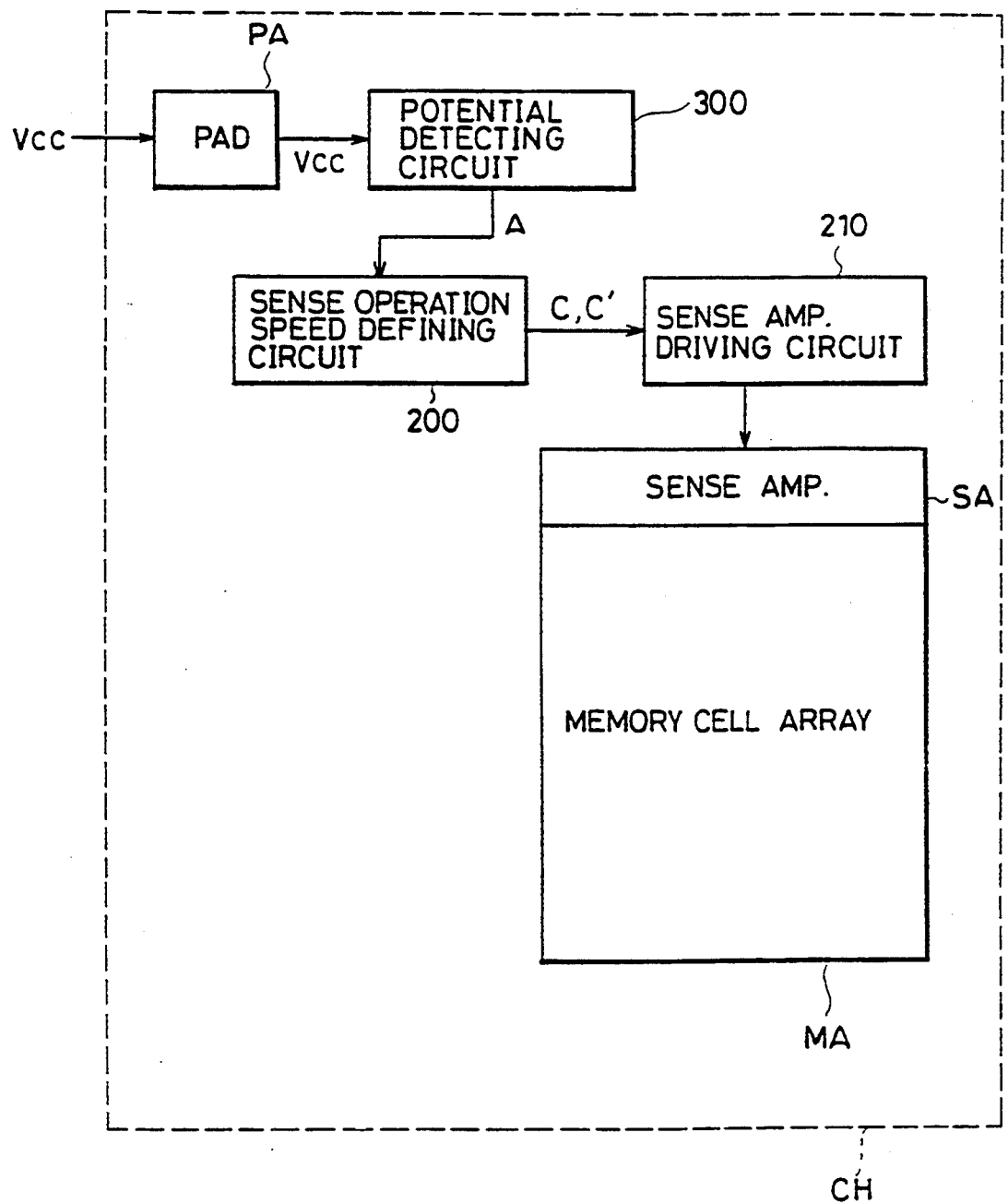
FIG. 16 is a schematic diagram of the entire configuration of a DRAM according to another embodiment of the present invention.

The foregoing embodiment has such a configuration in both cases of the lower supply voltage operation and the normal data reading/writing operation, that a control signal A is supplied via an external pin depending on the rated values of the supply voltage in order to define the operation speed and/or the operation timing of the sense amplifier. However, it is also possible to internally generate a signal for instructing the operation of the sense amplifier, instead of external application of the signal. FIG. 16 illustrates one example of the configuration that this sense amplifier operation defining signal is internally generated.

Referring to FIG. 16, in the DRAM according to another embodiment of the present invention, a potential detecting circuit 300 is connected to a pad PA for receiving supply voltage $V_{cc}$ externally applied. The potential detecting circuit 300 decides whether the supply voltage $V_{cc}$ from the pad PA is the normal supply voltage or the lower supply voltage, and then applies a signal corresponding to the result of this decision to a sense operation speed defining circuit 200 as a sense operation instructing signal. As for the configuration of this potential detecting circuit 300, such a configuration is considered as the simplest form that a voltage value between the normal operation supply voltage (5 V) and the lowered supply voltage (for example, 3.6 V) is employed as a reference voltage, to compare the magnitude of this reference voltage and of the operation supply voltage $V_{cc}$ applied to the pad PA, and to generate an operation instructing signal A based on the result of this comparison.

It is possible in this configuration to accurately define the operation speed and timing of the sense amplifier depending on the levels of the supply voltage $V_{cc}$, without providing an external pin terminal for defining the operation of the sense amplifier depending on the rated values of the supply voltage. The circuit configuration shown in FIG. 16 is also applicable to the circuit shown in FIG. 11. Therefore, if such a configuration is employed that an output of the potential detecting circuit 300 is applied to the switching signal generating circuit 200 in FIG. 11, the operation of the sense amplifier can be defined only by changing the supply voltage and by setting the timing of the control signals $\overline{CAS}$, $\overline{RAS}$ and $\overline{W}$, without particularly setting an address signal depending on the operation mode of the DRAM. As a result, the sense amplifier can be operated in the simpler control circuit.

The above described embodiments, both employing two different rated values of the supply voltage, describe the case that the DRAM is operated at these two different supply voltages. However, the DRAM can easily perform an accurate operation even at three different rated values of the supply voltage, if the timings to start the operating of the sense amplifier can be set depending on the respective rated values of the supply voltage.

The foregoing embodiments only describe in the sense amplifier the discharging operation of the bit lines of the lower potential. However, a sense amplifier comprising a p channel FET for charging the bit lines of the higher potential has its operation timing and operation speed cope with the operation of the n-FET sense amplifier, and similarly they are delayed and decreased, respectively. In that configuration, a driving signal lines of a p channel MOSFET sense amplifier, for example, is connected to the same configuration as shown in FIG. 7 or FIG. 8.

As has been described heretofore, according to the present invention, since the operation speed and/or the operation timing of the sense amplifier are/is made variable depending on the rated values of the supply voltage of the DRAM, the normal sensing and amplifying of the memory cell data can be performed even at each of the plurality of rated values of the supply voltage, and thus the DRAM having a plurality of rated supply voltages can be obtained in one common chip design specification.

Moreover, in the case of a configuration than the rated values of the supply voltage are varied depending on operation mode of the DRAM, and accordingly, the operation speed of the sense amplifier is also decreased, a considerable reduction in the power consumption of the DRAM can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory having a plurality of memory cells arranged in a matrix of rows and columns, a plurality of pairs of bit lines each connected to a column of said plurality of memory cells, and operable in a first operation mode for data writing/reading and a second operation mode for only holding stored data, said dynamic random access memory being supplied with supply voltages varied depending on an operation mode, comprising:

sensing means provided corresponding to each of said plurality of pairs of bit lines for sensing and amplifying a potential on each corresponding bit line pair;

operation timing means responsive to an operation mode defining signal designating one of said first and second operation modes, for generating a sense amplifier timing signal for defining operation speed and a timing of said sensing means in one cycle in the indicated operation mode; and driving means responsive to said sense amplifier timing signal and a sense amplifier activating signal for driving said sensing means.

2. The dynamic random access memory in accordance with claim 1, wherein said sense amplifier timing signal defines operation speed and start timing of said sensing means in a refresh cycle so that a refresh speed of said sensing means is reduced when a voltage supplied to said dynamic random access memory is less than a predetermined value.

3. The dynamic random access memory in accordance with claim 1, wherein said sense amplifier timing signal defines operation speed and start timing of said sensing means so that a starting timing of operation of said sensing means is delayed in a cycle of the designated operation mode when a voltage supplied to said dynamic random access memory is less than a predetermined value.

4. A dynamic type semiconductor memory device comprising:

a memory array including a plurality of memory cells arranged in rows and columns;

a plurality of pairs of bit lines arranged corresponding to respective columns and connecting memory cells on corresponding columns;

sensing means provided for respective pairs of bit lines, for differentially amplifying signal potential on corresponding pairs of bit lines;

a power supply node receiving a voltage of a first level in a normal operation mode in which an access is made to a selected memory cell for data reading and data writing, and a voltage of a second level lower than said first level in a data retention mode in which data stored in said memory cells are retained, delaying means for delaying a sense amplifier activation signal by a predetermined time with reference to an initiation of a memory cell selection operation both in said normal mode and in said data retention mode;

selection means responsive to a mode signal indicating one of the normal operation mode and said data retention mode, for selecting either one of the sense amplifier activating signal and an output of said delaying means to generate a sense amplifier driving signal which is at the first level in said normal operation mode and at the second level in said data retention mode; and driving means responsive to said sense amplifier driving signal for driving said sensing means.

5. A dynamic type semiconductor memory device comprising:

a memory cell array including a plurality of memory cells arranged in rows and columns;

a plurality of pairs of bit lines arranged corresponding to respective columns and connecting memory cells on corresponding columns;

a plurality of sense amplifiers provided for respective pairs of bit lines for differentially amplifying signal potential on corresponding pairs of bit lines;

a power supply node for receiving a power supply voltage;

detection means for detecting a level of a voltage at said power supply node;

determination means responsive to said detection means for determining at least one of an operation speed and an operation start timing of said sense amplifiers in a memory cell selection operation cycle; and drive means responsive to said determination means and a sense amplifier activating signal for driving said plurality of sense amplifiers.

* * * * *